(12) United States Patent
Heo et al.

(10) Patent No.: US 8,599,360 B2
(45) Date of Patent: Dec. 3, 2013

(54) REFLECTIVE RETICLE CHUCK, REFLECTIVE ILLUMINATION SYSTEM INCLUDING THE SAME, METHOD OF CONTROLLING FLATNESS OF REFLECTIVE RETICLE USING THE CHUCK, AND METHOD OF MANUFACTURING SEMICONDUCTOR DEVICE USING THE CHUCK

(75) Inventors: Jin-Seok Heo, Suwon-si (KR); Chang-Min Park, Hwaseong-si (KR); Jeong-Ho Yeo, Suwon-si (KR); Joo-On Park, Suwon-si (KR); In-Sung Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 382 days.

(21) Appl. No.: 12/948,370

(22) Filed: Nov. 17, 2010

(65) Prior Publication Data
US 2011/0128518 A1 Jun. 2, 2011

(30) Foreign Application Priority Data
Dec. 1, 2009 (KR) ........................ 10-2009-0118034

(51) Int. Cl.
*G03B 27/62* (2006.01)
*G03B 27/54* (2006.01)
*G03F 7/20* (2006.01)

(52) U.S. Cl.
CPC ............ *G03F 7/707* (2013.01); *G03F 7/70708* (2013.01)
USPC ................................ 355/75; 361/234; 355/67

(58) Field of Classification Search
CPC .. G03F 7/70691; G03F 7/707; G03F 7/70708
USPC ............ 279/128; 355/53, 67, 72, 75; 361/234
See application file for complete search history.

(56) References Cited

U.S. PATENT DOCUMENTS

| | | | | |
|---|---|---|---|---|
| 4,213,698 A | * | 7/1980 | Firtion et al. | 355/77 |
| 4,391,511 A | * | 7/1983 | Akiyama et al. | 355/40 |
| 4,666,291 A | * | 5/1987 | Taniguchi et al. | 355/52 |
| 4,737,824 A | * | 4/1988 | Sakai et al. | 355/53 |
| 4,875,765 A | * | 10/1989 | Vandenberg et al. | 359/849 |
| 5,204,784 A | * | 4/1993 | Spinhirne | 359/849 |
| 5,434,697 A | * | 7/1995 | Ameer | 359/224.1 |
| 5,793,474 A | * | 8/1998 | Nishi | 355/72 |
| 6,762,826 B2 | * | 7/2004 | Tsukamoto et al. | 355/72 |
| 6,897,940 B2 | * | 5/2005 | Sogard | 355/55 |
| 7,198,276 B2 | * | 4/2007 | Caldwell et al. | 279/128 |
| 7,420,299 B2 | | 9/2008 | Butler et al. | |
| 7,557,905 B2 | * | 7/2009 | Heo | 355/72 |
| 2005/0087939 A1 | * | 4/2005 | Caldwell et al. | 279/128 |
| 2005/0128462 A1 | * | 6/2005 | Matsui | 355/72 |
| 2005/0134829 A1 | * | 6/2005 | Ottens et al. | 355/75 |
| 2005/0263077 A1 | * | 12/2005 | Ganapathi Subramanian et al. | 118/728 |
| 2008/0079927 A1 | * | 4/2008 | Vernon | 355/75 |

* cited by examiner

FOREIGN PATENT DOCUMENTS

| | | |
|---|---|---|
| JP | 2004-031954 A | 1/2004 |
| JP | 2008-072100 A | 3/2008 |
| KR | 10-2007-0017597 A | 2/2007 |

*Primary Examiner* — Steven H Whitesell Gordon
(74) *Attorney, Agent, or Firm* — Lee & Morse, P.C.

(57) ABSTRACT

Provided are a reflective reticle chuck, a reflective illumination system including the chuck, a method of controlling the flatness of a reflective reticle using the chuck, and a method of manufacturing a semiconductor device using the chuck. The reflective reticle chuck includes a fixed portion and a mobile portion that together provide a securing surface for the reflective reticle. The mobile portion may alter a height of the securing surface relative to the fixed portion.

11 Claims, 10 Drawing Sheets

(a)　　　　　　　　(b)　　　　　　　　(c)

(a)

(b)

(a)

(b)

(a)

(b)

(a)

(b)

REFLECTIVE RETICLE CHUCK, REFLECTIVE ILLUMINATION SYSTEM INCLUDING THE SAME, METHOD OF CONTROLLING FLATNESS OF REFLECTIVE RETICLE USING THE CHUCK, AND METHOD OF MANUFACTURING SEMICONDUCTOR DEVICE USING THE CHUCK

BACKGROUND

1. Field

Example embodiments relate to a reflective reticle chuck used for a reflective illumination system, a reflective illumination system including the chuck, a method of controlling the flatness of a reflective reticle using the chuck, and a method of manufacturing a semiconductor device using the chuck.

2. Description of Related Art

With shrinkage of patterns of semiconductor devices, a photolithography technique using light with a shorter wavelength has been proposed.

SUMMARY

Example embodiments provide a reflective reticle chuck capable of controlling, e.g., improving, the flatness of a reflective reticle.

Also, example embodiments provide a reflective illumination system including a reflective reticle chuck capable of controlling, e.g., improving, the flatness of a reflective reticle.

Furthermore, example embodiments provide a method of controlling, e.g., improving, the flatness of a reflective reticle.

In addition, example embodiments provide a method of manufacturing a semiconductor device using a reflective illumination system including a reflective reticle chuck capable of controlling, e.g., improving, the flatness of a reflective reticle.

Aspects of the inventive concept should not be limited by the above description, and other unmentioned aspects will be clearly understood by one of ordinary skill in the art from example embodiments described herein.

According to example embodiments, a reflective reticle chuck may include a fixed portion and a mobile portion, the fixed portion and the mobile portion together providing a securing surface for receiving a reflective reticle, the mobile portion configured to be capable of altering a height of a portion of the securing surface relative to the fixed portion.

According to other example embodiments, a reflective reticle chuck may include a frame having a fixed plate shape corresponding to an outer region and a plurality of cells corresponding to a central region surrounded by the outer region and capable of rising and falling individually. Each of the cells may include at least one elevating actuator and portions of the frame may extend among the cells. The frame and the plurality of cells together may provide a securing surface for receiving a reflective reticle.

According to still other example embodiments, a reflective illumination system may include a light source, illumination mirrors, a reflective reticle chuck including a mobile portion and a fixed portion, the fixed portion and the mobile portion together providing a securing surface for receiving a reticle, the mobile portion configured to be capable of altering a height of the securing surface relative to the fixed portion projection mirrors, and a wafer stage.

According to yet other example embodiments, a method of controlling, e.g., improving, flatness of a reflective reticle may include measuring the flatness of the reflective reticle, attaching the reflective reticle to a reflective reticle chuck having a fixed portion and a mobile portion, the fixed portion and the mobile portion together providing a securing surface for receiving the reflective reticle, and controlling the flatness of the reflective reticle. Controlling the flatness of the reflective reticle may include moving the mobile portion to alter a height of a corresponding portion of the reticle relative to the fixed portion. The reflective reticle chuck may include a frame, and a plurality of cells disposed in the center of the frame and capable of rising and falling.

According to yet other example embodiments, a method of manufacturing a semiconductor device may include loading a wafer into a reflective illumination system to mount the wafer on a wafer stage installed in the reflective illumination system, the reflective illumination system including a reflective reticle mounted on a reflective reticle chuck installed in a reflective illumination system, the reflective reticle chuck having a fixed portion and a mobile portion, the fixed portion and the mobile portion together providing a securing surface for receiving the reflective reticle, directing light from a light source included in the reflective illumination system to the reflective reticle, and directing light reflected by the reflective reticle to the wafer.

The reflective reticle chuck may include a frame having a fixed plate shape corresponding to an outer region, and a plurality of cells corresponding to a center region surrounded by the outer region and capable of rising and falling. Each of the cells includes at least one elevating actuator, and a portion of the frame extends among the cells. The frame may include flat portions.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
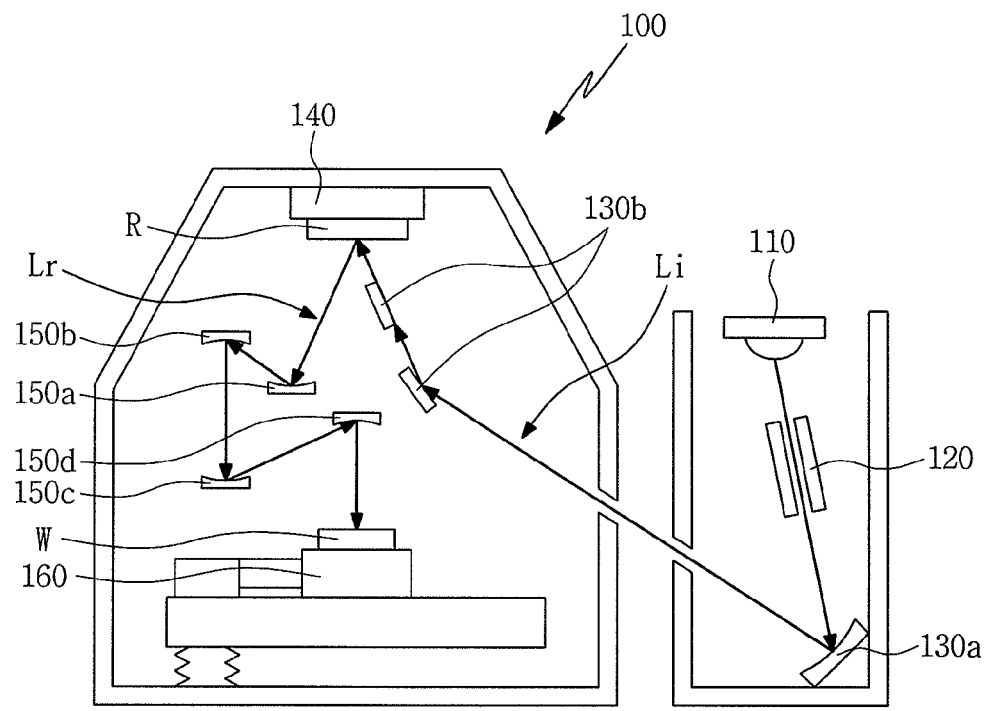
FIG. 1 illustrates a schematic diagram of a reflective illumination system according to example embodiments.

Korean Patent Application No. 10-2009-0118034, filed on Dec. 1, 2009, in the Korean Intellectual Property Office, and entitled: "Reflective Reticle Chuck, Reflective Illumination System Including the Same, Method of Improving Flatness of Reflective Reticle Using the Chuck, and Method of Manufacturing Semiconductor Device Using the Chuck," is incorporated by reference herein in its entirety.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thicknesses of layers and regions may be exaggerated for clarity. Like numbers refer to like elements throughout.

Embodiments of the present inventive concept are described herein with reference to plan and cross-section illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. Thus, the regions illustrated in the figures are schematic in nature and their shapes are not intended to illustrate the precise shape of a region of a device and are not intended to limit the scope of the present inventive concept.

In the present specification, a reflective reticle or reflective reticle chuck should be interpreted as a reticle and reticle chuck used in a reflective illumination system using extreme ultraviolet (EUV) light. The reticle may have a reflection function, while the reflective reticle chuck does not have a reflection function, and thus something described with the term "reflective" should be merely interpreted as being capable of being used for a reflective illumination system.

The present inventive concept provides a reflective illumination system, and all terms used in a description of the technical scope and spirit of the inventive concept should be interpreted as normally used terms of a reflective illumination technique, unless the context clearly indicates otherwise.

FIG. 1 illustrates a schematic diagram of a reflective illumination system according to example embodiments. Referring to FIG. 1, a reflective illumination system 100 may include a light source 110, relay mirrors 120, illumination mirrors 130a to 130c, a reticle chuck 140, projection mirrors 150a to 150d, and a wafer stage 160.

The light source 110 may output EUV light Li. The relay mirrors 120 and the illumination mirrors 130a and 130c may transmit EUV light Li output by the light source 110 toward the reticle chuck 140. A reticle R may be attached to the reticle chuck 140.

The reticle chuck 140 may secure the reticle R based on electromagnetic principles. That is, the reticle R may be electromagnetically attached and fixed to the entire surface of the reticle chuck 140. In other words, the reticle R may be attached to the entire surface of the reticle chuck 140 due to an electromagnetic force. The reticle chuck 140 may apply a physical force to the reticle R. That is, the reticle chuck 140 may control, e.g., improve, the flatness of the reticle R. According to the inventive concept, the flatness of the reticle R may include the flatness of a substrate of the reticle R, the flatness of a reflective layer, and the flatness of a focal plane of an optical pattern. That is, the reticle chuck 140 may function to improve the flatness of the reticle R.

The reticle R may not be part of the reflective illumination system 100. However, the reticle R is illustrated with the reflective illumination system 100 for ease of explanation of the operation of the reflective illumination system 100.

Although the reticle R is a reflective reticle, a modifier "reflective" will be omitted hereinbelow. Specifically, the reticle R may include a multilayered reflective layer disposed on a reticle substrate and a light absorption pattern disposed thereon. Since the structure of the reticle R is well known, a detailed description thereof will be omitted.

The projection mirrors 150a to 150d may receive EUV light Lr from the reticle chuck 140 and transmit the EUV light Lr toward the wafer stage 150. The EUV light Lr transmitted by the projection lenses 150a to 150d may include optical pattern information on the reticle R. The wafer stage 160 may be mounted on a wafer W. The wafer W may receive the optical pattern information on the reticle R through the projection mirrors 150a to 150d.

Figure 2:
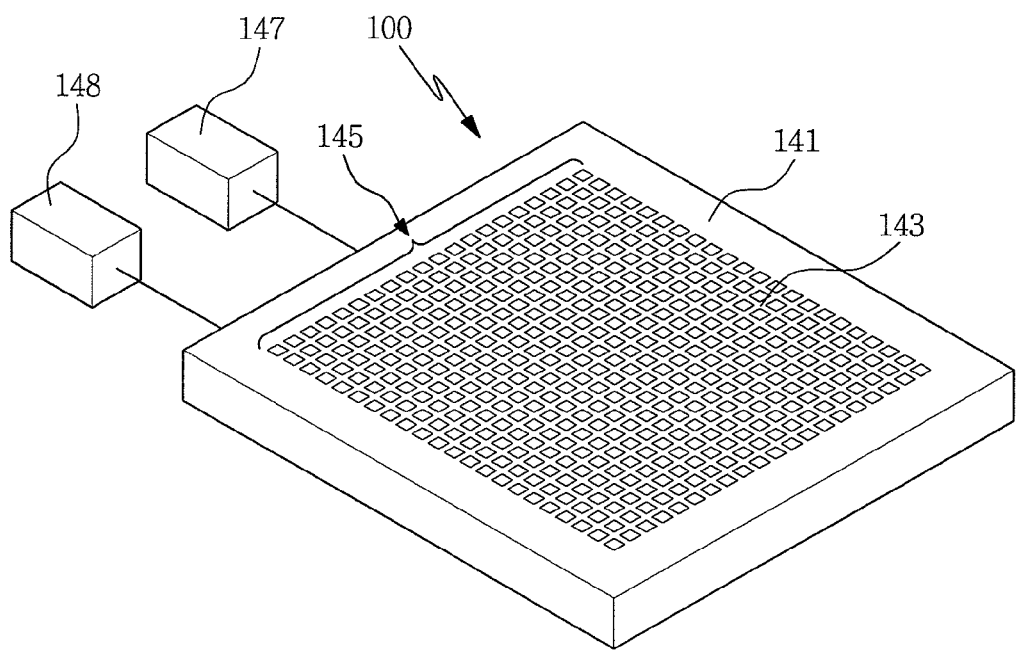
FIG. 2 illustrates a conceptual perspective view of a reticle chuck according to example embodiments.

FIG. 2 illustrates a conceptual perspective view of a reticle chuck according to example embodiments. Referring to FIG. 1 and FIG. 2, the reticle chuck 140 may include a fixed portion 141 and a mobile portion 145. The fixed portion 141 may be an outer region or periphery of the reticle chuck 140, and the mobile portion 145 may be a central region of the reticle chuck 140. The reticle chuck 140 may also include an electromagnetic force generator 147 and a processor 148. The electromagnetic force generator 147 may provide a force for securing the reticle R to the reticle chuck 140. The processor 148 may control the mobile portion 145 to appropriately control the flatness of the reticle R.

The fixed portion 141 and the mobile portion 145 together provide a securing surface for receiving the reticle R. The mobile portion 145 may move, e.g., rise or fall, relative to the securing surface. If the reticle R were perfectly flat, the mobile portion 145 and the fixed portion 141 would provide a perfectly planar surface. However, in practice, reticles are not perfectly flat. Therefore, the mobile portion 145 may be used to control a flatness of the reticle, e.g., to compensate for deviations in reticles from perfectly flat, by raising/lowering a corresponding portion of the reticle relative to the securing surface to control, e.g., improve, the flatness thereof.

The fixed portion 141 may have a fixed plate shape. In the present embodiments, the fixed portion 141 will be described using a term "frame" for brevity. The mobile portion 145 may be separated from the fixed portion 141 and include a plurality of unit mobile portions. The plurality of unit mobile portions may independently rise and fall relative to the securing surface.

In the present embodiments, each of the unit mobile portions will be described using a term "cell." That is, the reticle chuck 140 may include a frame 141 and a plurality of cells 145. In FIG. 2, the frame 141 may be separated from the reflective illumination system 100 and turned upside down. That is, the meaning of terms "up/down" and "rise/fall" may depend on the drawings throughout the present specification. That is, an upward direction and a downward direction do not refer to specific directions but should be interpreted as being exchangeable and understandable only with reference to the drawings.

The frame 141 may correspond to an outer portion of the reticle chuck 140. The frame 141 may have a rectangular plate shape and a planar top surface. The frame 141 may further extend among the cells 145 in the central region. That is, the frame 141 may include a grating-type sub-frame 143 interposed among the cells 145. The frame 141 may be formed of stainless steel (SUS) and an insulating buffer material, e.g., Teflon®, rubber, and the like, and may be further formed on one surface of the frame 141.

In FIG. 2, many components required for the reticle chuck 140 are omitted for brevity and clarity. The standard of the reticle chuck 140 may be set according to the kinds of the reflective illumination system 100 and the reticle R. Specifically, the length of an outer side of the frame 140 may not be limited, but may be variously set according to the characteristics of each system. Also, even a set standard of the reticle chuck 140 may be varied according to the standard and characteristics of the reticle R attached to the reticle chuck 140. Accordingly, numerical values of the reticle chuck 140 are not significant.

Each of the cells 145 may include elevating activators. Thus, the cells 145 may rise and fall individually. As the cells 145 rise, the reticle R attached to the reticle chuck 140 may receive physical pressure. As the cells 145 fall, the reticle R may receive an attractive force. Thus, the flatness of a portion of the reticle R may be affected so that a protrusion or a recess may be formed in the portion of the reticle R. Also, when the cells 145 disposed in a specific region rise, fall, or have a certain tendency, a large region of the reticle R may protrude or be recessed. The levels by which the cells 145 rise or fall may be divided into several steps or may be continuous, i.e., in an analog mode. The flatness of the reticle R may be controlled more precisely in an analog mode.

The cells 145 may be formed in various shapes, e.g., squares as illustrated in FIG. 2, and sizes. Accordingly, the cells 145 may be variously applied according to the characteristics of the reticle R. For instance, when the optical pattern of the reticle R is less precise or the flatness of the reticle R does not need to be precisely controlled, the cells 145 may be formed to a larger size and/or at greater intervals. Conversely, when the optical pattern of the reticle R is more precise or the flatness of the reticle R needs to be precisely controlled, the cells 145 may be formed to a smaller size and/or at smaller intervals.

Various specific experiments were conducted using the cells 145 having each side with a length of about 3 mm. The experiments were conducted not to optimize the technical sprit of the inventive concept but to embody the technical spirit of the inventive concept. As the size of the cells 145 decreases, forming and controlling the reticle chuck 140 may become more difficult, while as the size of the cells 145 increases, controlling the flatness of the reticle R may become more difficult. Thus, the size of the cells 145 may be appropriately selected. The cells 145 may have various surface shapes. For example, the cells 145 may have a square shape as shown in FIG. 2, a circular shape, an elliptical shape, and/or any one of various polygonal shapes. When the cells 145 rise and apply a physical force to the reticle R, the applied force may uniformly spread out along the surfaces of the cells 145 and finally concentrate on one point according to a height to which the cells 145 rise.

Thus, the surface shape of the cells 145 may be variously set and formed. For example, when the optical pattern of the reticle R has a 2-dimensional shape, that is, when the optical pattern of the reticle R is a contact pattern, the cells 145 may have a circular or square shape. Also, when the optical pattern of the reticle R has a 1-dimensional shape, that is, when the optical pattern of the reticle R is a line-and-space pattern, the cells 145 may have an elliptical or rectangular shape. From a different point of view, each of the cells 145 according to the inventive concept may be interpreted as having a shape similar to a piston.

Figure 3:
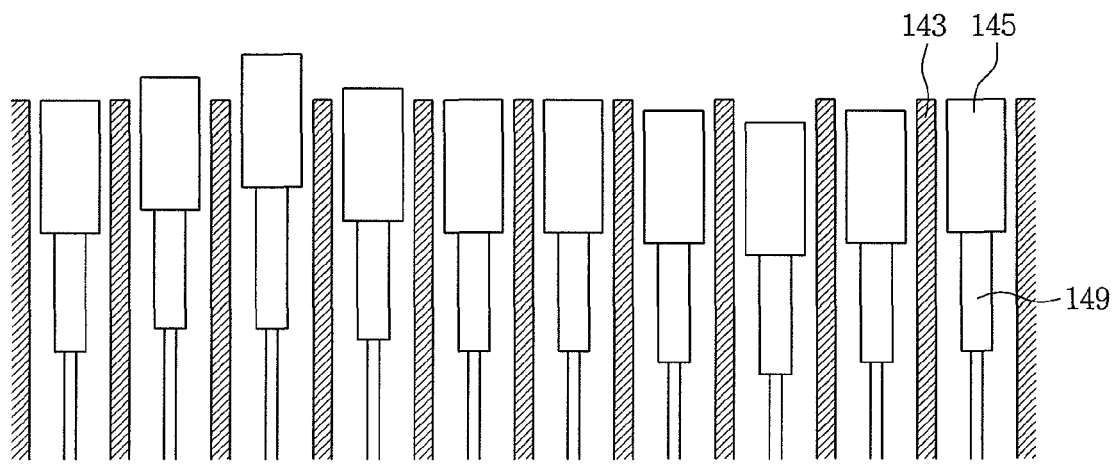
FIG. 3 illustrates a longitudinal sectional view of a reticle chuck according to example embodiments.

FIG. 3 illustrates a longitudinal sectional view of a reticle chuck according to example embodiments. Referring to FIG. 3, cells 145 may be interposed among sub-frames 143. Each cell 145 may include elevating actuators 149 that may rise or fall separately. The cells 145 may rise or fall due to the operation of the elevating actuators 149. The cells 145 may rise or fall to various heights, e.g., over a continuous range.

That is, the cells 145 may rise or fall in an analog mode. The rise or fall of the cells 145 may be variously embodied according to a method of driving the elevating actuators 149. For example, the elevating actuators 149 may be driven using various methods, such as a screw, a step motor, a bevel gear, or a hydraulic cylinder. A distance by which the cells 145 rise or fall may not have the same influence on the flatness of the reticle R. This is because a substrate, reflective layer, and/or light absorption layer of the reticle R may absorb pressure, so that a distance by which the cells 145 move may not linearly affect the flatness of the reticle R. Thus, specific numerical values of the distance by which the cells 145 rise or fall are not significant.

Figure 4A:
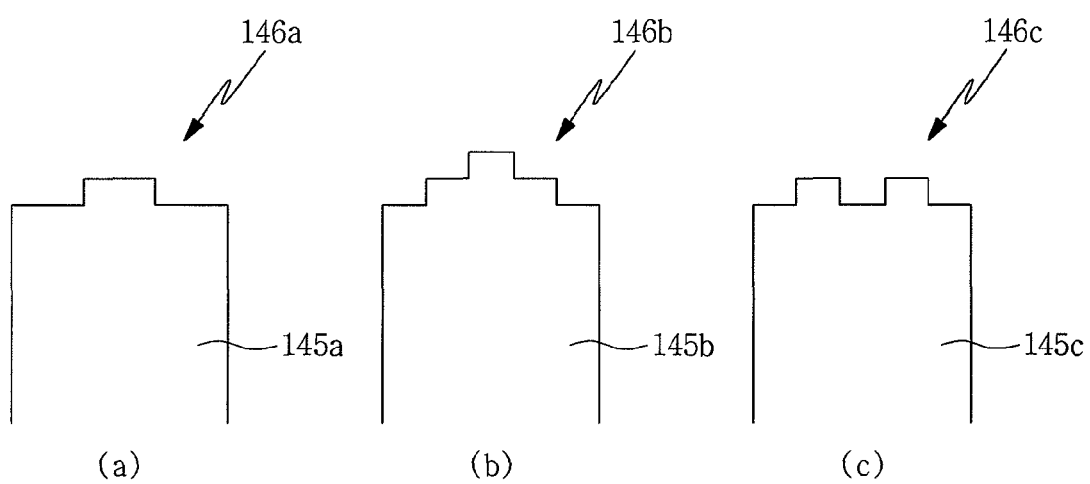
FIGS. 4A through 4C illustrate longitudinal sectional views of top surfaces of cells according to various example embodiments.
Figure 4B:
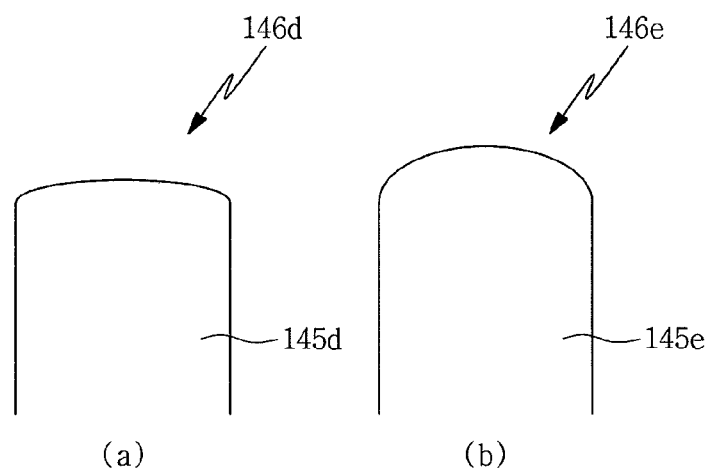
Figure 4C:
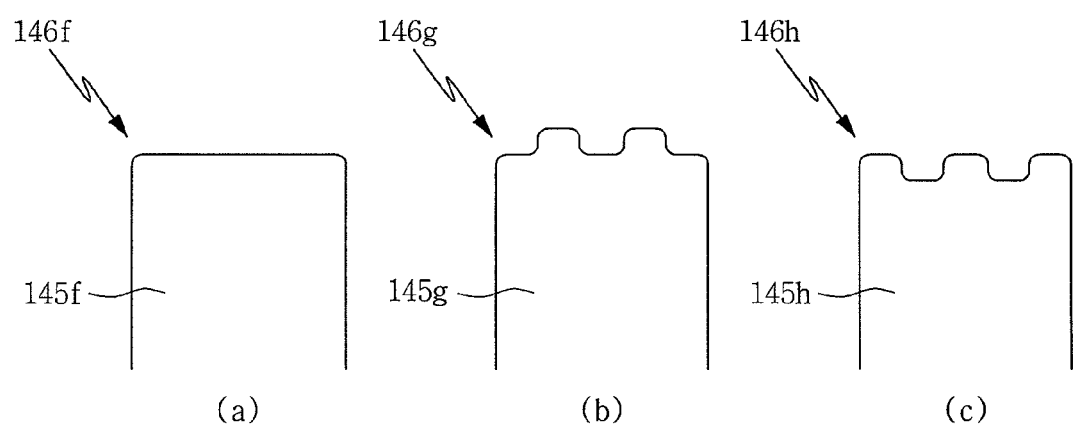

FIGS. 4A through 4C are longitudinal sectional views of top surfaces of cells according to various example embodiments.

Referring to FIG. 4A, cells 145a to 145c may include stepwise top surfaces 146a to 146c. The number of steps is not limited thereto. FIG. 4A exemplarily illustrates top surfaces 146a to 146c having various numbers of steps. As the number of steps increases, the flatness of the reticle R may not be physically damaged, but may be controlled.

Referring to FIG. 4B, cells 145d to 145e may have semispherical top surfaces 146d to 146e. As the radius of curvature of the semispherical top surfaces 146d to 146e decreases, physical damage to the reticle R may be reduced. The radius of curvature of the top surfaces 146d to 146e may be variously determined.

Referring to FIG. 4C, cells 145f to 145h may include planar top surfaces 146f to 146h with curved edges. The radius of curvature of the curved edges of the cells 145f to 145h may be variously determined, and as the radius of curvature of the curved edges thereof increases, physical damage to the reticle R may be reduced. The curved edges may be on stepwise top surfaces, e.g., 146g to 146h.

Figure 5A:
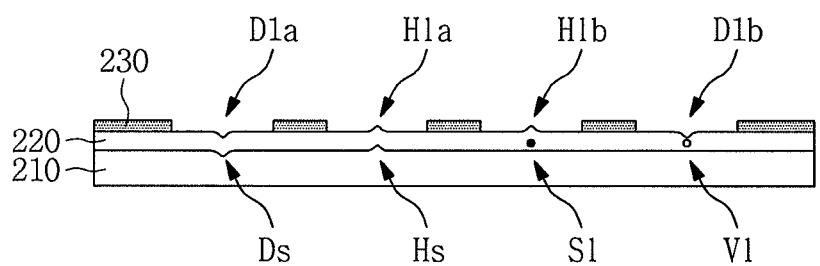
FIGS. 5A and 5B illustrate diagrams showing controlling the flatness of a reticle using a reticle chuck according to example embodiments.
Figure 5B:
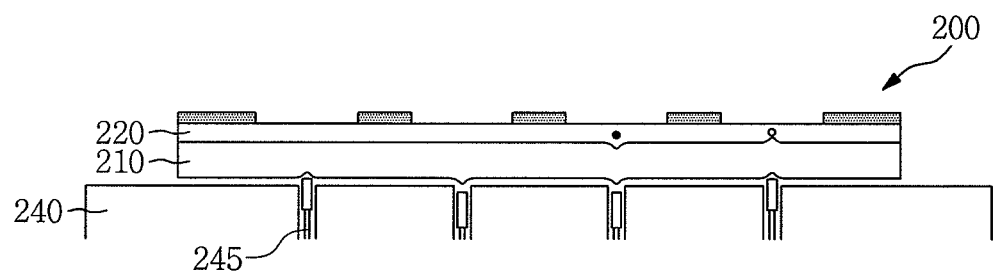

FIGS. 5A and 5B illustrate controlling, e.g., improving, the flatness of a reticle using a reticle chuck according to example embodiments. Referring to FIG. 5A, defects Ds, Hs, Sl, and Vl may occur in a substrate 210 or a reflective layer 220 of a reticle 200. A substrate dent Ds or a substrate hump Hs may be present on the surface of the substrate 210. The substrate dent Ds may cause a dent Dla in the surface of the reflective layer 220, while the substrate hump Hs may cause a hump Hla in the surface of the reflective layer 220. The dent Dla formed in the surface of the reflective layer 220 and/or the hump Hla formed in the surface of the reflective layer 220 may occur independently of the substrate dent Ds and/or the substrate hump Hs. A spot defect Sl formed in the reflective layer 220 may cause a hump Hlb in the surface of the reflective layer 220, while a vacancy defect Vl formed in the reflective layer 220 may cause a dent Dlb in the surface of the reflective layer 220. The hump Hlb formed in the surface of the reflective layer 220 and/or the dent Dlb formed in the surface of the reflective layer 220 may occur even if the spot and vacancy defects Sl and Vl are absent in the substrate 210. Absorption patterns 230 configured to absorb light to obtain optical information may be formed on the reflective layer 220.

Referring to FIG. 5B, cells 245 of the reticle chuck 240 corresponding to positions where defects of the reticle 200 occur may rise or fall, thereby correcting the flatness of the reticle 200. The raised portions of the cells 245 may apply physical pressure to a rear surface of the substrate 210 so that the surface flatness of the reflective layer 220 may be controlled, e.g., improved or corrected. The sunk portions of the cells 245 may not support the rear surface of the substrate 210 so that the surface flatness of the reflective layer 220 may be controlled, e.g., improved or corrected due to an electromagnetic attraction force of the reticle chuck 240.

Figure 6A:
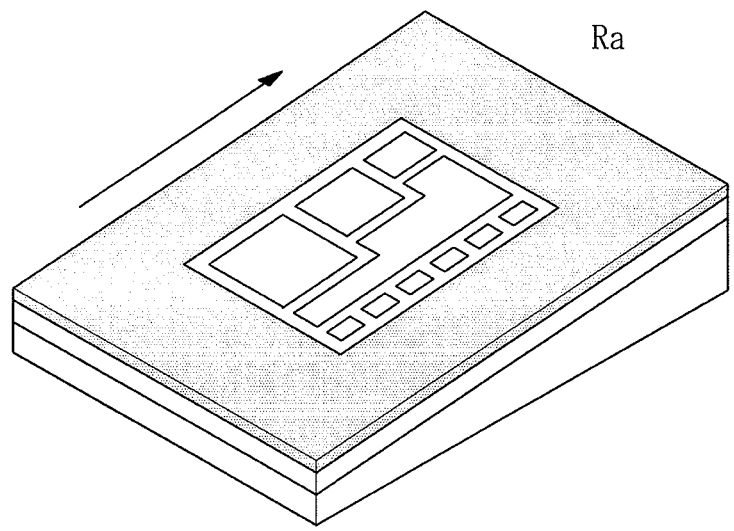
FIGS. 6A through 6D illustrate diagrams showing controlling the overall flatness of a reticle using a reticle chuck according to example embodiments.
Figure 6A:
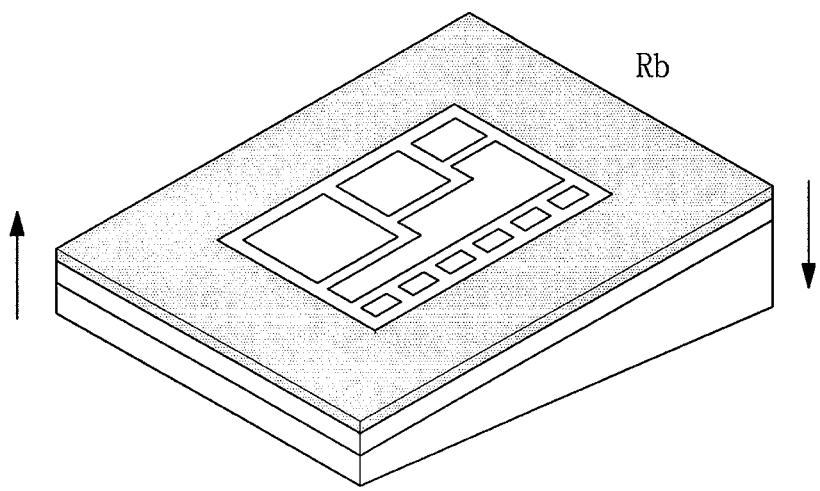
Figure 6B:
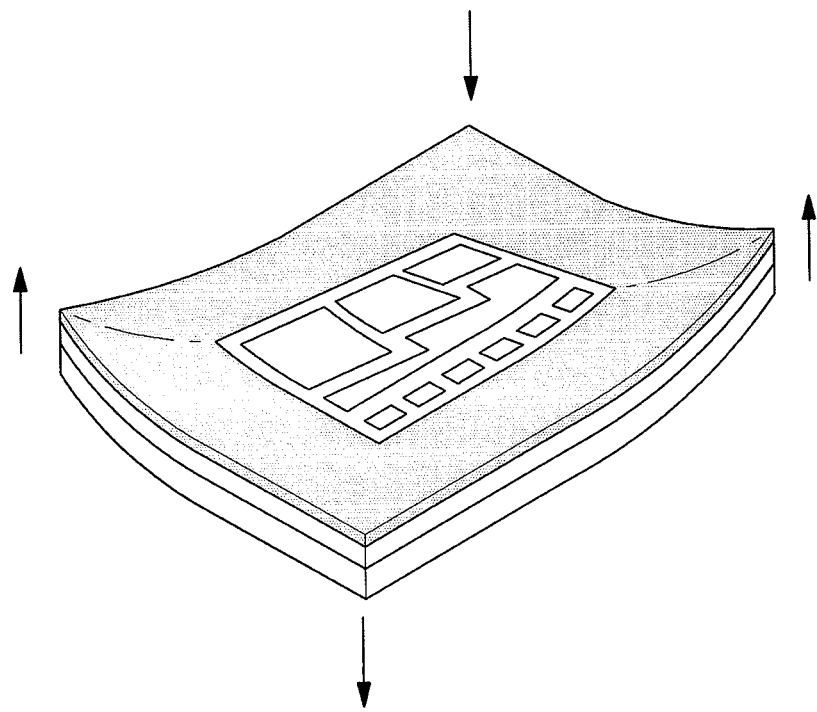
Figure 6B:
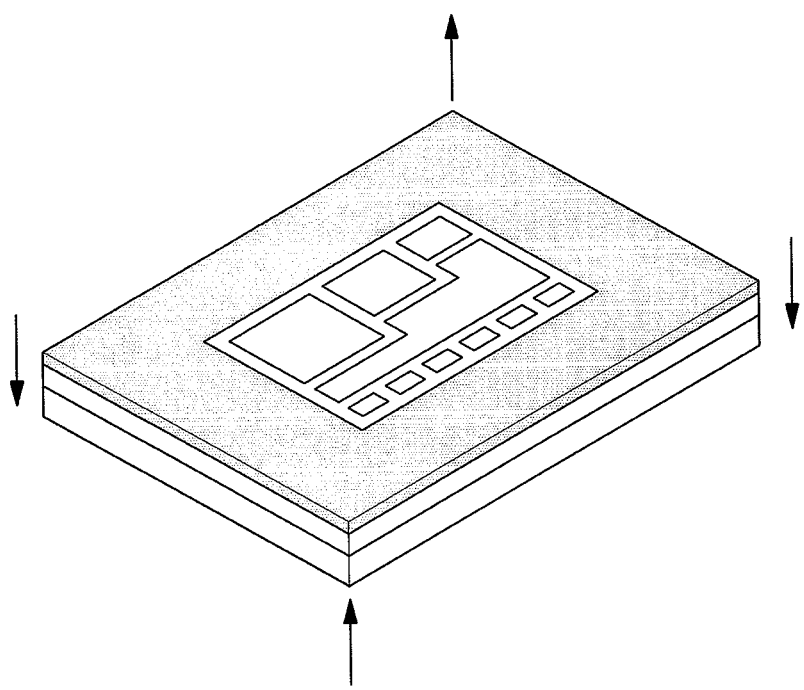
Figure 6C:
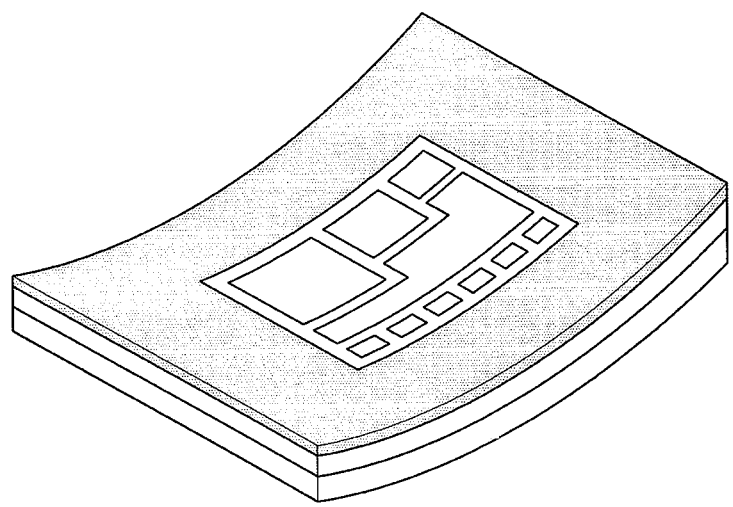
Figure 6C:
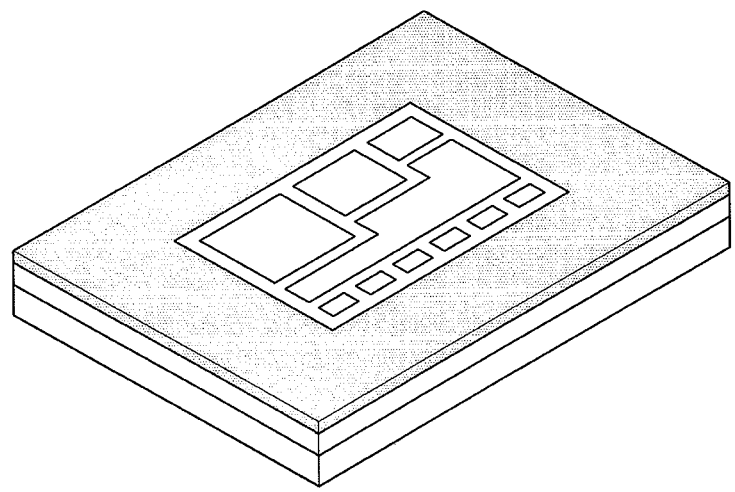
Figure 6D:
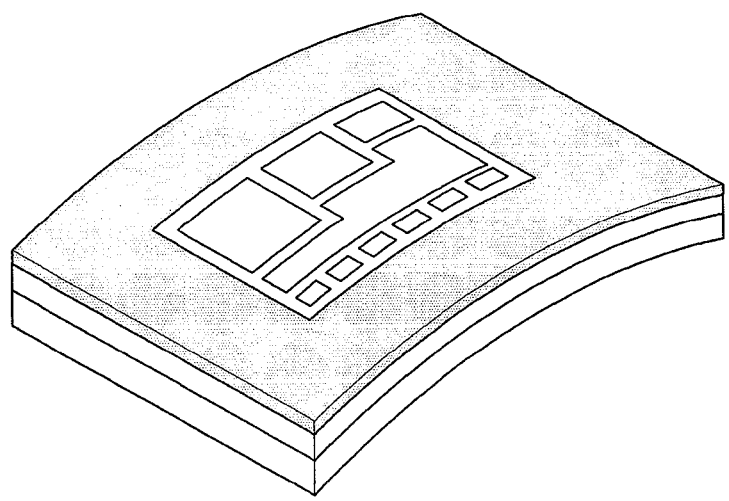
Figure 6D:
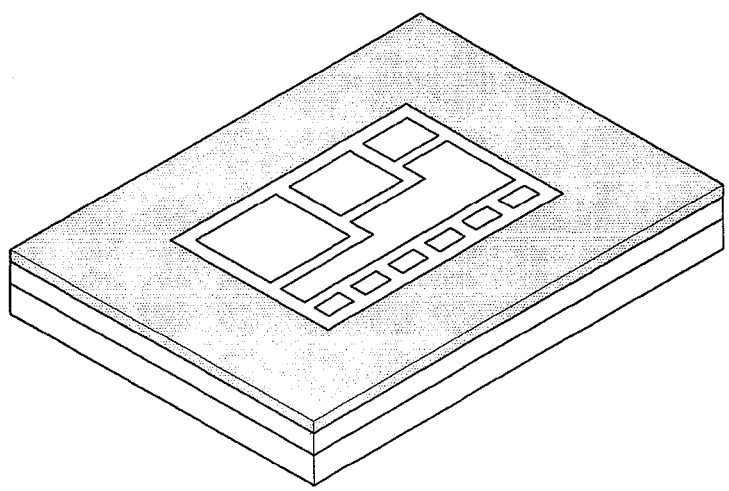

FIGS. 6A through 6D illustrate control, e.g., improvement, in the overall flatness of a reticle using a reticle chuck according to example embodiments. Referring to FIG. 6A, an inclined surface of the reticle may be generally planarized. A reticle substrate that has an upward slope in an arrow direction as shown in case (a) may be generally planarized as shown in case (b). Referring to FIG. 6B, a reticle having a distorted shape may be generally planarized. Referring to FIG. 6C, a reticle having a bent shape in a negative direction as shown in case (a) may be generally planarized as shown in case (b). Referring to FIG. 6D, a reticle having a bent shape in a positive direction as shown in case (a) may be generally planarized as shown in case (b). In FIGS. 6C and 6D, no arrow is shown because the technical spirit of the inventive concept can be understood without difficulty. In view of the above-described cases, it can be seen that uneven surfaces of reticles may be generally planarized.

Figure 7:
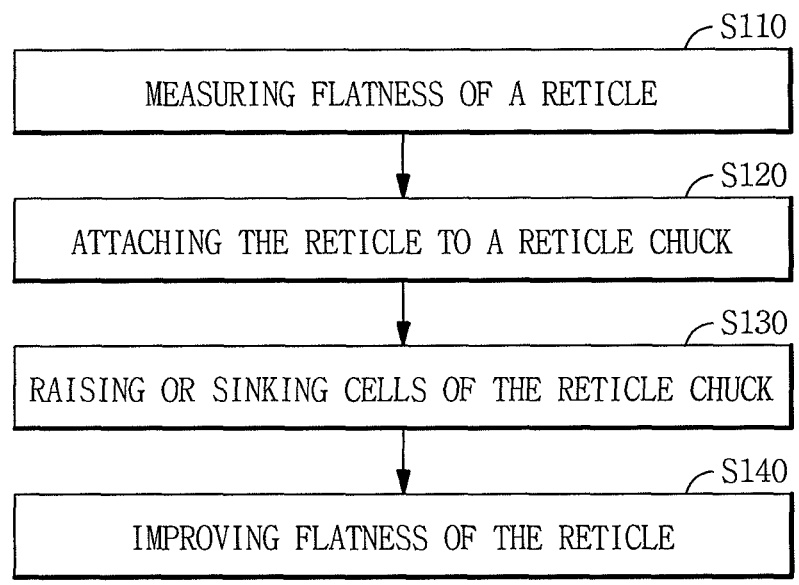
FIG. 7 illustrates a flowchart illustrating a method of controlling the flatness of a reticle using an illumination system according to example embodiments.

FIG. 7 illustrates a flowchart of a method of controlling, e.g., improving, the flatness of a reticle using an illumination system according to example embodiments. Referring to FIG. 7, the method of controlling, e.g., improving, the flatness of the reticle may include measuring the flatness of the reticle, attaching the reticle to a reticle chuck having cells, and selectively raising or falling/sinking the cells of the reticle chuck to control, e.g., improve, the flatness of the reticle. The flatness of the reticle may be measured using various methods, such as test simulations and a real exposure process. Flatness information on the reticle may be generally analyzed and indicated in detail using coordinates. The method of controlling, e.g., improving, the flatness of the reticle according to the inventive concept may be performed using the flatness information of the reticle. The flatness information regarding the reticle may be provided to the chuck processor 148 to appropriately adjust cells 145.

Figure 8A:
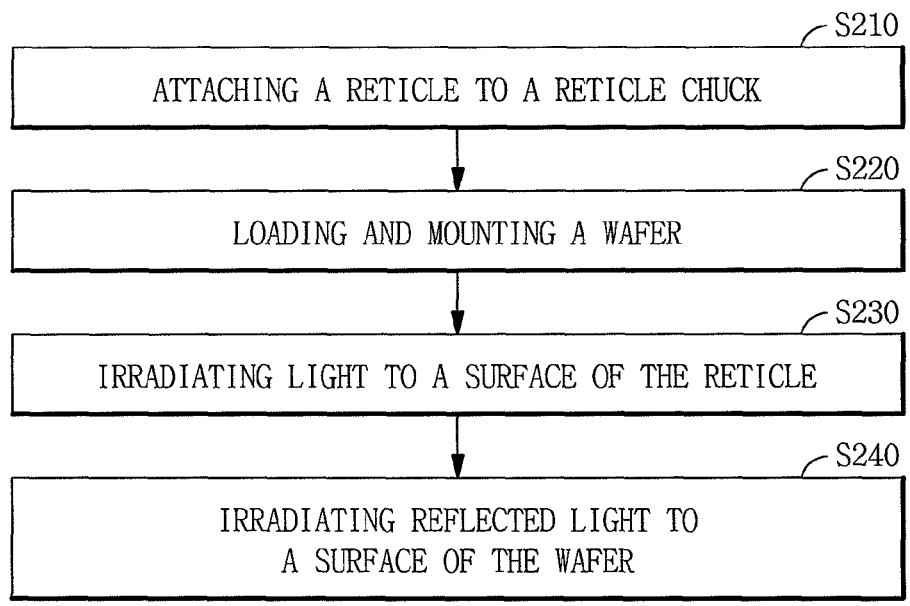
FIGS. 8A and 8B illustrate flowcharts of methods of processing a semiconductor device using a reflective illumination system according to example embodiments.
Figure 8B:
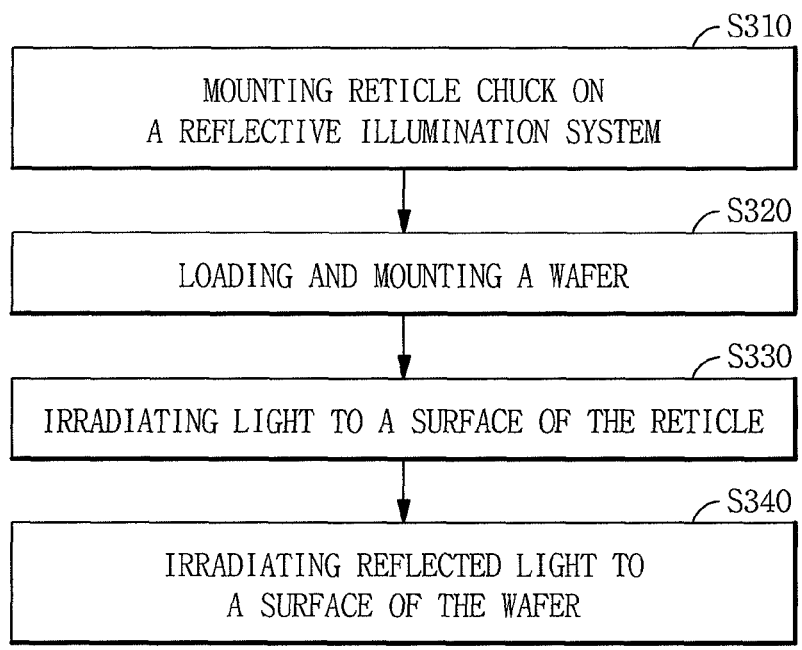

FIGS. 8A and 8B illustrate flowcharts of methods of processing a semiconductor device using a reflective illumination system according to example embodiments. Referring to FIGS. 1 through 3 and 8A, a method of processing a semiconductor device using a reflective illumination system may include attaching a reflective reticle R to a reticle chuck 140 of a reflective illumination system 100, loading a wafer W into the reflective illumination system 100 to mount the wafer W on the wafer stage 160, allowing a light source 110 to irradiate light Li toward the surface of the reticle R, and irradiating light Lr reflected by the surface of the reticle R toward the surface of the wafer W. The reticle chuck 140 may function to control, e.g., improve, the flatness of the reticle R according to the inventive concept. The reticle chuck 140 may have already been altered to improve the flatness of the reticle R. Alternatively or additionally, after the reticle R is attached to the reticle chuck 140, the methods may further include selectively raising or falling cells 145 of the reticle chuck 140 to control, e.g., improve, the flatness of the reticle R.

Referring to FIGS. 1 through 3 and 8B, a method of processing a semiconductor device using a reflective illumination system may include mounting a reticle chuck 140 to which a reticle R is attached on a reflective illumination system 100, loading a wafer W into the reflective illumination system 100 to mount the wafer W on the wafer stage 160, allowing a light source 110 to irradiate light Li toward the surface of the reticle R, and irradiating light Lr reflected by the surface of the reticle R toward the surface of the wafer W. The reticle chuck 140 may function to control, e.g., improve, the flatness of the reticle R. That is, the reticle chuck 140 may include cells 145 capable of rising and falling separately. In general, a process of attaching the reticle R to the reticle chuck 140 may not be performed each time a photolithography process is performed. Unless other particulars are found during the process, after the reticle R is attached to the reticle chuck 140, the flatness of the reticle R may be controlled, e.g., improved or corrected, and the process of loading the wafer W into the reflective illumination system 100 and the process of irradiating the light Li emitted by the light source 110 through the reticle R to the wafer W may be repeated. The reticle chuck 140 may have already controlled the flatness of the reticle R.

In addition, the names and functions of additional components corresponding to a full system that have not been shown for simplicity may be easily understood with reference to other drawings and descriptions of the present specification.

According to the example embodiments as described above, the flatness of a reflective reticle can be precisely controlled even during a semiconductor fabrication process. Thus, it is unnecessary to fabricate the reflective reticle again, and even a reflective reticle with poor flatness can be employed. Also, since the lifespan of the reflective reticle is increased, the productivity of reflective reticles and semiconductor devices can be improved, and yield can be increased.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A reflective reticle chuck, comprising:
a frame in an outer portion; and
a plurality of cells in a central region, the cells including:
fixed portions having a grating shape, and
mobile portions in the fixed portions, the fixed portion and the mobile portion together providing a securing surface for receiving a reflective reticle, the mobile portion configured to be capable of altering a height of a portion of the securing surface relative to the fixed portion.

2. The chuck as claimed in claim 1, wherein the center region has a tetragonal shape.

3. The chuck as claimed in claim 1, wherein the mobile portions are configured to be capable of rising above the securing surface of the fixed portion individually.

4. The chuck as claimed in claim 3, wherein the mobile portions are configured to be capable of falling below the securing surface individually.

5. The chuck as claimed in claim 3, wherein the frame surrounds the plurality of cells and extends among respective cells to define the grating shaped fixed portions, such that the fixed portions have a lattice shape with openings therethrough, and the mobile portions are positioned in the openings.

6. The chuck as claimed in claim 3, wherein the top surfaces of the cells have a circular shape.

7. The chuck as claimed in claim 3, wherein each of the cells has a curved upper edge.

8. The chuck as claimed in claim 1, wherein the mobile portions are configured to be capable of altering the height in a continuous manner.

9. The chuck as claimed in claim 1, further comprising an electromagnetic force generator providing a force to secure the reflective reticle to the securing surface.

10. A reflective reticle chuck, comprising:
a frame having a fixed plate shape corresponding to an outer region; and a plurality of cells corresponding to a center region surrounded by the outer region and capable of rising and falling individually, wherein each of the cells includes an elevating actuator, and a grating shaped portion of the frame extends among the cells, the frame and the plurality of cells together providing a securing surface for receiving a reflective reticle.

11. A reflective illumination system comprising:

a light source;

illumination mirrors;

a reflective reticle chuck including a frame in an outer portion and a plurality of cells in a central region, each of the cells including:

fixed portions defining a grating shape, and a mobile portion in each opening of the grating-shaped fixed portions, the fixed portion and the mobile portion together providing a securing surface for receiving a reflective reticle, the mobile portion configured to be capable of altering a height of the securing surface relative to the fixed portion;

projection mirrors; and a wafer stage.

* * * * *